United States Patent
Yang et al.

(10) Patent No.: US 11,231,654 B2
(45) Date of Patent: *Jan. 25, 2022

(54) SELF-REFERENCING AND SELF-CALIBRATING INTERFERENCE PATTERN OVERLAY MEASUREMENT

(71) Applicant: GLOBALFOUNDRIES U.S. Inc., Malta, NY (US)

(72) Inventors: Dongyue Yang, Lawrenceville, NJ (US); Xintuo Dai, Rexford, NY (US); Dongsuk Park, Mechanicville, NY (US); Minghao Tang, Ballston Lake, NY (US); Md Motasim Bellah, Malta, NY (US); Pavan Kumar Chinthamanipeta Sripadarao, Clifton Park, NY (US); Cheuk Wun Wong, Malta, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 51 days.

This patent is subject to a terminal disclaimer.

(21) Appl. No.: 16/847,721

(22) Filed: Apr. 14, 2020

(65) Prior Publication Data
US 2020/0241429 A1    Jul. 30, 2020

Related U.S. Application Data

(63) Continuation of application No. 15/869,150, filed on Jan. 12, 2018, now Pat. No. 10,705,435.

(51) Int. Cl.
*G03F 7/20*    (2006.01)
*G03F 9/00*    (2006.01)

(52) U.S. Cl.
CPC ........ *G03F 7/70633* (2013.01); *G03F 9/7019* (2013.01); *G03F 9/7049* (2013.01);
(Continued)

(58) Field of Classification Search
None
See application file for complete search history.

(56) References Cited

U.S. PATENT DOCUMENTS 6,150,231 A    11/2000   Muller et al.
6,949,462 B1 *  9/2005   Yang ............... G03F 9/7065
                                                     438/650
(Continued)

FOREIGN PATENT DOCUMENTS

CN      1973246 A      5/2007
CN    104849956 A      8/2015
(Continued)

OTHER PUBLICATIONS

Brunner et al., "Moire Technique forOverlay Metrology," Proc. SPIE 0480, Integrated Circuit Metrology II, 1984, pp. 1-8.

(Continued)

*Primary Examiner* — Kara E. Geisel
*Assistant Examiner* — Jarreas C Underwood
(74) *Attorney, Agent, or Firm* — Gibb & Riley, LLC; Anthony J. Canale

(57) ABSTRACT

Two pairs of alignment targets (one aligned, one misaligned by a bias distance) are formed on different masks to produce a first pair of conjugated interference patterns. Other pairs of alignment targets are also formed on the masks to produce a second pair of conjugated interference patterns that are inverted the first. Misalignment of the dark and light regions of the first interference patterns and the second interference patterns in both pairs of conjugated interference patterns is determined when patterns formed using the masks are overlaid. A magnification factor (of the interference pattern misalignment to the target misalignment) is calculated as a ratio of the difference of misalignment of the relatively dark and relatively light regions in the pairs of interference patterns, over twice the bias distance. The interference (Continued)

pattern misalignment is divided by the magnification factor to produce a self-referenced and self-calibrated target misalignment amount, which is then output.

19 Claims, 6 Drawing Sheets

(52) U.S. Cl.
CPC .......... G03F 9/7076 (2013.01); G03F 9/7084 (2013.01); G03F 9/7088 (2013.01); G03F 7/70216 (2013.01)

(56) References Cited

U.S. PATENT DOCUMENTS

| | | | | |
|---|---|---|---|---|
| 6,982,793 B1* | 1/2006 | Yang | ............... | G03F 7/70633 356/401 |
| 7,608,468 B1* | 10/2009 | Ghinovker | .......... | G03F 7/70633 438/16 |
| 7,633,618 B2* | 12/2009 | Monshouwer | ......... | G01B 11/27 257/797 |
| 7,667,842 B2 | 2/2010 | Schulz | | |
| 7,796,311 B2* | 9/2010 | Holmes | ................ | B42D 25/29 359/2 |
| 9,058,535 B2* | 6/2015 | Guigan | ............... | G07D 7/003 |
| 9,182,219 B1* | 11/2015 | Manassen | ............. | G06T 7/0004 |
| 9,784,690 B2* | 10/2017 | Sapiens | ................ | G01N 21/93 |
| 9,903,823 B2 | 2/2018 | Lu et al. | | |
| 2006/0024850 A1 | 2/2006 | Monahan et al. | | |
| 2006/0044568 A1* | 3/2006 | Weiss | ................. | G03F 7/70633 356/509 |
| 2008/0067801 A1* | 3/2008 | Schilling | ............... | B42D 25/29 283/72 |
| 2010/0005442 A1* | 1/2010 | Ghinovker | ............. | G06F 30/39 716/55 |
| 2013/0208279 A1 | 8/2013 | Smith | | |
| 2014/0375984 A1* | 12/2014 | Choi | ................... | G01N 21/93 356/73 |
| 2016/0093574 A1* | 3/2016 | Cai | ........................ | G03F 9/708 438/695 |
| 2019/0049860 A1 | 2/2019 | Middlebrooks et al. | | |

FOREIGN PATENT DOCUMENTS

| | | |
|---|---|---|
| EP | 1 400 855 A2 | 3/2004 |
| TW | 200421039 A | 10/2004 |

OTHER PUBLICATIONS

Li et al., "Sub-20-nm Alignment in Nanoimprint Lithography Using Moire Fringe," Nano Letters, American Chemical Society, vol. 6, No. 11, 2006, pp. 2626-2629.

Zaidi et al., "Moire Interferometric Alignment and Overlay Techniques," Proc. SPIE 2196, Integrated Circuit Metrology, Inspection, and Process Control VIII, 1994, pp. 1-12.

International Application No. PCT/US2018/067011, International Preliminary Report on Patentability dated Mar. 20, 2020, pp. 1-19.

International Application No. PCT/US2018/067011, Written Opinion of the International Preliminary Examining Authority dated Dec. 5, 2019, pp. 1-6.

Taiwanese Application No. 107145904, Notice of Allowance dated Oct. 22, 2019, pp. 1-3.

Lee et al., "Process Resilient Overlay Target Designs for Advanced Memory Manufacture," Proceedings of SPIE, vol. 10145, 2017, pp. 1-12.

International Application No. PCT/US2018/067011, International Search Report and Written Opinion dated May 16, 2019, pp. 1-12.

Taiwanese Application No. 107145904, Examination Report dated Aug. 20, 2019 and Search Report dated Aug. 19, 2019, pp. 1-13.

U.S. Appl. No. 15/869,150, Office Action Communication dated Nov. 18, 2019, pp. 1-15.

U.S. Appl. No. 15/869,150, Notice of Allowance dated Mar. 30, 2020, pp. 1-11.

CN Application No. 201880085680.8, Search Report dated Apr. 11, 2021, pp. 1-2 and Office Action dated Apr. 19, 2021, pp. 1-4.

\* cited by examiner

SELF-REFERENCING AND SELF-CALIBRATING INTERFERENCE PATTERN OVERLAY MEASUREMENT

CROSS-REFERENCE TO RELATED APPLICATIONS

The present invention claims the benefit under 35 U.S.C. § 120 as a continuation of presently pending U.S. patent application Ser. No. 15/869,150 filed on Jan. 12, 2018, the entire teachings of which are incorporated herein by reference.

BACKGROUND

Field of the Invention

The present disclosure relates to the alignment of masks used in integrated circuit (IC) manufacturing, and more specifically, to self-referencing and self-calibrating interference pattern overlay measurement methods and systems.

Description of Related Art

Fabrication of integrated circuits generally involves the formation of multiple integrated circuit patterns on one or more layers over a substrate wafer. These patterns generally include numerous regions formed through photolithography. Photolithography uses patterns to define regions on a substrate. More specifically, with photolithography, a photoresist layer is formed on a substrate, and is exposed to radiation, such as ultraviolet light (UV), which is transmitted through transparent areas of a mask to cause a chemical reaction in corresponding regions of the photoresist. The photoresist is then developed to produce a pattern of open areas that expose the underlying material, with the other areas of the material are still protected by the photoresist. Depending on whether a positive or negative tone resist is used, the exposed or unexposed portions of the photoresist layer are removed. The portions of the substrate not protected by the photoresist are then etched to form the features in the substrate.

The relative positioning and alignment, or "overlay," between masks controls whether the resultant integrated circuits are formed properly. Minimizing overlay error is a significant concern in the manufacturing of integrated circuits. Overlay metrology minimizes overlay errors by using overlay marks in the same layer as the functional circuit structure. The overlay marks may include different patterns that may then be scanned and/or imaged by an overlay metrology tool. Some overlay marks (Moiré targets) combine to generate a diffraction pattern (Moiré pattern) that can be measured to determine the accuracy of the overlay of the different masks. Many different types of overlay metrology patterns have been developed to improve the accuracy of overlay metrology measurements.

Advancing technology continues to make smaller structures in integrated circuit (IC) devices. The complexity of advancing technology process has put a heavy burden on lithography control parameters such as overlay for multiple layers. Having an overlay out of specification may result in open circuits or shorts in the structures, which not only impacts wafer/die yield, but also impacts process throughput due to the necessity to rework the device.

SUMMARY

Various method herein establish a first Moiré target having a first pitch on a first optical mask, and establish a second Moiré target having a second pitch on the first optical mask. The second Moiré target is adjacent to, and aligned with, the first Moiré target. These methods similarly establish a third Moiré target having the second pitch on a second optical mask, and establish a fourth Moiré target having the first pitch on the second optical mask. The third Moiré target is adjacent to the fourth Moiré target. The third Moiré target is misaligned with the fourth Moiré target by a bias distance.

The first Moiré target and the third Moiré target form first interference patterns. The second Moiré target and the fourth Moiré target also form second interference patterns. Further, the first interference patterns and the second interference patterns form a first pair of conjugated interference patterns. Also, the first interference patterns and the second interference patterns form a first pair of conjugated interference patterns.

The first Moiré target, the second Moiré target, the third Moiré target, and the fourth Moiré target are a first set of targets. Such methods further establish a second set of targets that is identical to the first set of targets, and is inverted relative to the first set of targets, on the first optical mask and the second optical mask to produce a second pair of conjugated interference patterns that is inverted relative to the first pair of conjugated interference patterns.

Following this, these methods perform a first exposure using the first optical mask to produce an integrated circuit layer having the first Moiré target and the second Moiré target of the identical, inverted, sets of targets. Methods herein also perform a second exposure using the second optical mask (when, for example, performing overlay measurement to determine if a photoresist is properly aligned, forming more structures, or doing mask alignment before exposure). The second exposure has the third Moiré target and the fourth Moiré target of both sets of targets.

This allows the methods herein to determine interference pattern misalignment of the relatively dark and relatively light regions of the first interference patterns and the second interference patterns in both pairs of conjugated interference patterns when patterns in the second optical mask (that are in the photoresist, or are being projected) are over the integrated circuit layer. Further, these methods calculate a magnification factor (of the interference pattern misalignment to the target misalignment) as a ratio of the difference of misalignment of the relatively dark and relatively light regions in the pairs of interference patterns, over twice the bias distance. Then, the methods herein divide the interference pattern misalignment by the magnification factor to produce a self-referenced and self-calibrated target misalignment amount, which is then output.

Various systems herein can include, among other components, a processor; and a manufacturing system and an optical alignment measurement system connected to the processor over a computerized network. The processor is specifically adapted to, or is capable of, establishing a first Moiré target having a first pitch on a first optical mask, and establishing a second Moiré target having a second pitch on the first optical mask. The second Moiré target is adjacent to, and aligned with, the first Moiré target. Similarly, the processor is specifically adapted to, or is capable of, establishing a third Moiré target having the second pitch on a second optical mask, and establishing a fourth Moiré target having the first pitch on the second optical mask. The third Moiré target is adjacent to the fourth Moiré target. The third Moiré target is misaligned with the fourth Moiré target by a bias distance.

The first Moiré target and the third Moiré target form first interference patterns. The second Moiré target and the fourth Moiré target form second interference patterns. The first interference patterns and the second interference patterns form a first pair of conjugated interference patterns.

The first Moiré target, the second Moiré target, the third Moiré target, and the fourth Moiré target are a first set of targets. The processor is specifically adapted to, or is capable of, establishing a second set of targets that is identical to the first set of targets, and is inverted relative to the first set of targets, on the first optical mask and the second optical mask to produce a second pair of conjugated interference patterns that is inverted relative to the first pair of conjugated interference patterns.

The manufacturing system is specifically adapted to, or is capable of, performing a first exposure using the first optical mask to produce an integrated circuit layer having the first Moiré target and the second Moiré target of both sets of targets. Similarly, the manufacturing system is specifically adapted to, or is capable of, performing a second exposure using the second optical mask. The second exposure has the third Moiré target and the fourth Moiré target of both sets of targets.

The optical alignment measurement system is specifically adapted to, or is capable of, determining interference pattern misalignment of relatively dark and relatively light regions of the first interference patterns and the second interference patterns in both pairs of conjugated interference patterns, when photoresist patterns formed using the second optical mask are over the integrated circuit layer. Also, the processor is specifically adapted to, or is capable of, calculating a magnification factor of the interference pattern misalignment to target misalignment, as a ratio of the difference of misalignment of the relatively dark and relatively light regions in the pairs of interference patterns, over twice the bias distance. Similarly, the processor is specifically adapted to, or is capable of, dividing the interference pattern misalignment by the magnification factor to produce and output a self-referenced and self-calibrated target misalignment amount.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
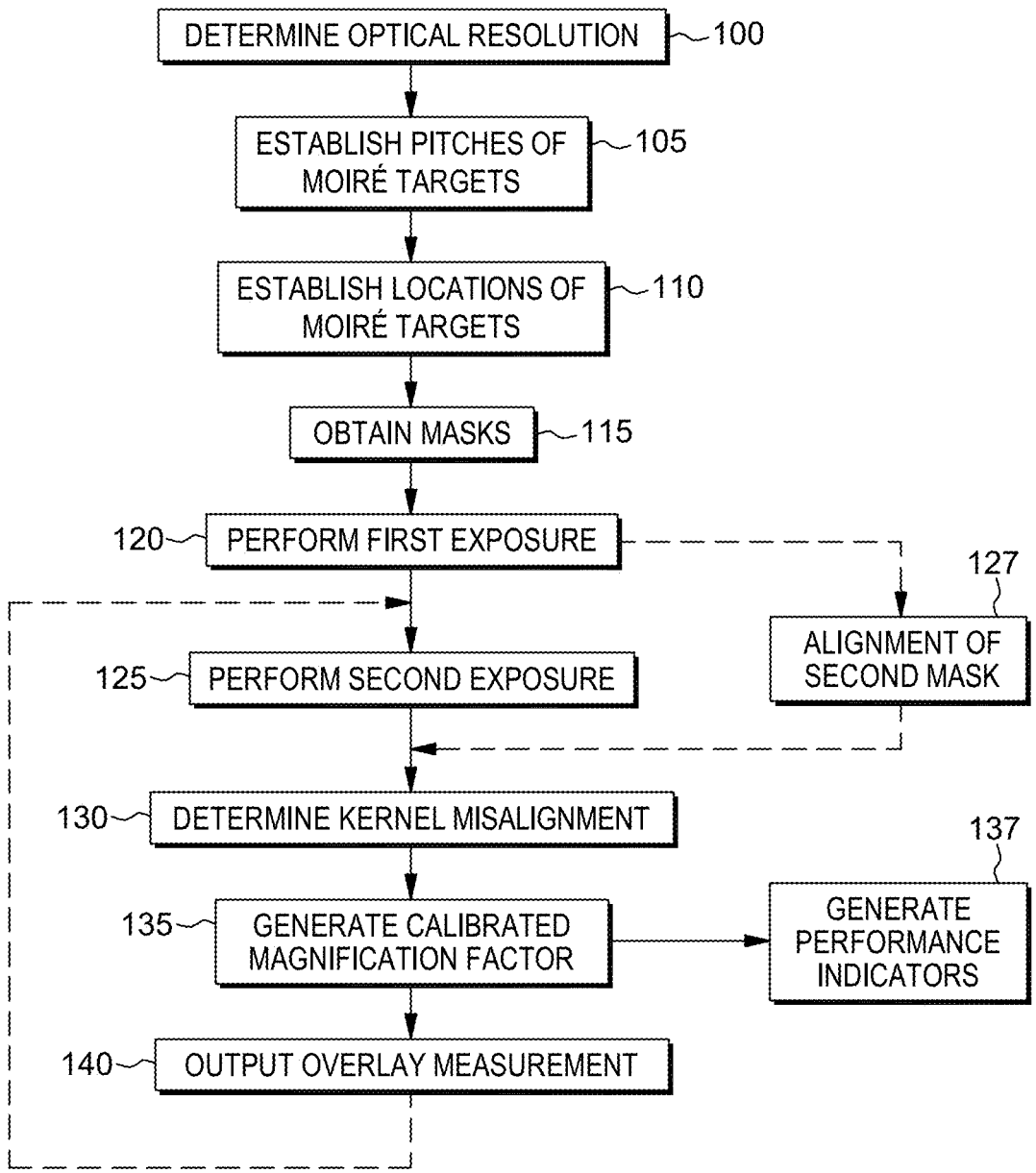
FIG. 1 is a flow diagram illustrating embodiments herein.

Methods and systems herein provide enhanced contrast masks used with photolithographic processing by producing a self-referencing, self-calibrating target design, which generates a target performance indicator. More specifically, two pairs of alignment targets (one aligned, one misaligned by a bias distance) are formed on different masks to produce a first pair of conjugated interference patterns. Other pairs of alignment targets are also formed on the masks to produce a second pair of conjugated interference patterns that are inverted the first. Misalignment of the dark and light regions of the first interference patterns and the second interference patterns in both pairs of conjugated interference patterns is determined when patterns formed using the masks are overlaid. A magnification factor (of the interference pattern misalignment to the target misalignment) is calculated as a ratio of the difference of misalignment of the relatively dark and relatively light regions in the pairs of interference patterns, over twice the bias distance. Then, the interference pattern misalignment is divided by the magnification factor to produce a self-referenced and self-calibrated target misalignment amount, which is then output.

Therefore, without having to use reference marks, and without using the much slower scanning electro-microscopy (SEM) processing (but obtaining the same or greater alignment precision as SEM processing), the methods and systems herein self-reference and self-calibrate the alignment of only Moiré interference pattern targets to provide faster feedback than SEM processing, but with the same accuracy as SEM processing.

As also noted previously overlay tolerances are becoming increasingly critical as required by shrinking design rules and increasing process complexity. Current tech nodes require tight overlay budgets, imposing a severe challenge to current overlay metrology systems. Process effects and optical effects, such as imaging resolution and aberrations, limit imaging overlay accuracy. Often, due to its high precision and accuracy, SEM based overlay (SEMOVL) is used to calibrate optical overlay. However SEMOVL suffers from long measurement time (low throughput), and not being able to feedback OVL information in time.

To address these and other issues, this disclosure presents a self-referenced (SR) MoiréOVL scheme that greatly enhances the overlay delectability by magnifying the response of signal kernel to overlay shift (by a magnification factor $1/f_{SR}$ of more than one order, where $f_{SR}$ is the self-referenced magnification factor). In this disclosure, the MoiréOVL target is designed with enhanced signal contrast for image-based overlay (IBO), which enables design of dense kernel pitches. Also, this self-referencing design greatly improves the accuracy of the measurement. Thus, factors (such as target asymmetry) which cause traditional IBO inaccuracy are not amplified in MoiréOVL kernels, and therefore the calibrated MoiréOVL inaccuracy is reduced by a factor of $1/f_{SR}$. With these systems and methods, the MoiréOVL offers a possibility of achieving SEMOVL accuracy and precision, by optical overlay means. Further, this self-referencing MoiréOVL can be implemented and measured in the architecture of current image based overlay systems.

More specifically, this disclosure presents a self-calibrated (SC) MoiréOVL in combination with the self-referencing design, to further calibrate the MoiréOVL magnification factor for each mark. The self-calibration design incorporated in this MoiréOVL enables checking the fidelity of the magnification factor, therefore an accurate and precise OV can be achieved, and the calibration results can be used as a key performance indicator for MoiréOVL mark/measurement. Also, the self-calibration and self-reference can be measured at the same time to increase the throughput. The optimization of the target design through simulation and the characterization of mark and measurement quality can result from this disclosure.

Thus, this disclosure presents an overlay metrology employing Moiré patterns to magnify the kernel response to overlay misalignment, thus enhancing the kernel sensitivity and delectability. A Moiré pattern is formed and observed when the top grating and bottom grating have close but different pitches. In general, the Moiré pitch equals the maximum density pitch, which is resolvable by optical means, and can be calculated using the following expression:

$$p_{Moir\acute{e}} = \frac{p_1 p_2}{p_1 - p_2}.$$

With systems and methods herein, the MoiréOVL target design accommodates current IBO schematics. Here, the kernels (the dark areas between the light areas) in the Moiré interference patterns are large enough for IBO optical resolution, which makes the OVL kernels resolvable by current IBO tools (Optical Resolution<$p_{Moir\acute{e}}$). Further, the Moiré pitch is maintained small enough to accommodate, for example, at least 5 pitches in one target, to ensure the precision of MoiréOVL is comparable, or better than, conventional IBO targets ($p_{Moir\acute{e}}$<Target size/5). However, either the top or bottom grating pitch is not optically resolvable by IBO tools, and this minimizes the interference between the signal from top/bottom gratings to Moiré pitches, and this enhances the Moiré pitch contrast significantly ($P_{top}(P_{bottom})$<Optical Resolution).

Also, this processing balances the top and bottom grating reflecting signal strength to further enhance the signal contrast. For example, the methods and systems herein tune top/bottom grating critical dimensions (CD) to modulate signal strength. This design guideline is adopted for target design and optimization, and is verified on the wafer. The critical dimension (CD) tuning to further improve signal contrast precision can be further simulated considering the kernel contrast modulation by OVL stack geometries and materials.

For advanced inspection metrology (AIM) design, the number of bars can be placed in one mark is generally limited by kernel contrast. If kernels (bars) are too close to each other, the kernel contrast between bars and spaces in between will be degraded. However, as noted above, the methods and systems herein intentionally set one or both of the top or bottom grating pitch to not be optically resolvable by IBO tools. Thus, resulting from this top and bottom optical unresolvable pitch, the dense-kernel design presented herein takes advantage of the high contrast signal between the optically resolvable Moiré kernel and the unresolvable background pitches. Hence, the precision of the measurement is greatly increased by the dense kernel design produced by methods and systems herein. Compared to the size of current conventional AIM targets, this disclosed design provides robust signal contrast precision, while saving large amounts of real estate for metrology.

Therefore, methods herein provide enhanced contrast masks used with photolithographic processing by producing a self-referencing, self-calibrating target design, which generates a target performance indicator. More specifically, the methods herein use Moiré targets of parallel marks having different pitches, which produce dark and light Moiré interference patterns (kernels) when the Moiré targets are overlaid.

As shown in the flowchart in FIG. 1, in item 100, the methods herein enhance target contrast by determining the minimum optical resolution of a photolithographic optical alignment measurement system. The methods can then establish a first pitch of a first Moiré target, and a second pitch of an adjacent Moiré target, in item 105 by setting at least one of the pitches below the minimum optical resolution of the optical alignment measurement system. However, in item 105, these methods set the difference between the first pitch and the second pitch to generate Moiré interference patterns (kernels or dark stripes) that are above the minimum optical resolution of the optical alignment measurement system. In other words, in item 105, the pitches are set so that the optical alignment measurement system cannot detect the lines of the individual Moiré targets (the Moiré targets are optically unresolvable), but can detect the dark lines/stripes of the kernels of the Moiré interference patterns. These methods further enhance target contrast by establishing the pitches to produce some minimum number (e.g., at least 5, at least 10, etc.) parallel marks in each of the Moiré targets in item 105.

These methods provide additional enhanced contrast by setting the first pitch relative to the second pitch to balance the strength of reflection of the first Moiré target and reflection of the second Moiré target in item 105. When balancing the strength of reflection, in item 105, these methods determine the strength of reflection based on sizes of features (e.g., line widths, gap widths, etc.) in the Moiré targets, and based on the transparency, thickness, surface texture/reflectivity, geometries etc., of the materials of the layers of the integrated circuit device being produced.

With respect to producing a self-referencing, self-calibrating target design, which generates a target performance indicator, in item 110 methods herein establish a first location for the first Moiré target, and a second location for the second, adjacent Moiré target, on a first optical mask. The first Moiré target has features (e.g., parallel lines separated by spaces) occurring at a first pitch (e.g., spacing, frequency, occurrence, etc.), and the second Moiré target has similar features occurring at a second pitch, which is different from the first pitch.

The first Moiré target in the first location is adjacent to, and aligned with, the second Moiré target in the second location on the first optical mask. More specifically, the Moiré targets are parallel lines and gaps between the lines running in a first direction. The first and second Moiré targets are immediately adjacent one another in the first direction on the first optical mask. Also, while the first and second Moiré targets have different pitches, they are aligned, meaning that the center of gravity (COG) of each Moiré target lies along the same line (parallel to the first direction). In other words, the very center (for example a line or a gap) of the first Moiré target lies along the same line (in the first direction) as the very center of the second Moiré target.

In a similar way, in item 110 the methods herein establish a third location for a third Moiré target and a fourth location for a fourth Moiré target on a second optical mask. The third location on the second optical mask corresponds to (is the same as) the first location on the first optical mask, and the fourth location on the second optical mask corresponds to (is the same as) the second location on the first optical mask. This causes the first and third Moiré targets to make up a first pair of targets, and the second and fourth Moiré targets make up a second pair of targets that are immediately adjacent to one another, allowing kernels of such pairs to be compared optically.

The third Moiré target has features similar to that discussed above occurring at the second pitch, and the fourth Moiré target has similar features occurring at the first pitch. In some implementations, the first Moiré target and the fourth Moiré target can be identical, and the second Moiré target and the third Moiré target can be identical.

The third Moiré target is similarly immediately adjacent to the fourth Moiré target; however, in contrast to the first optical mask, in addition to having different pitches, the third Moiré target is not aligned with (is offset or biased relative to) the fourth Moiré target on the second optical mask. The distance of this bias is in a second direction perpendicular to the first direction, and this bias distance allows the kernels produced by the pairs of targets to be self-referencing and self-calibrating, and allows methods herein to generate a target performance indicator. Thus, the pairs of targets are immediately adjacent to, and aligned, with each other (even if, within one of the pairs, the targets themselves are intentionally misaligned).

As used herein, targets that are "immediately adjacent" are spaced apart from one another (in the direction parallel to the lines and gaps in the Moiré targets) a close enough distance to allow optical comparison (that is, for example, equal to less than 50 times, less than 25 times, less than 10 times, etc., the width of the parallel lines (or the gaps) in the Moiré target) and may be spaced as closely as just a few (e.g., 5) of the gaps. Thus, the pairs of Moiré targets are spaced close enough to one another on the masks to allow optical observation of whether the dark lines (kernels) produced by each pair of Moiré targets are aligned by an automated optical mask alignment system.

The first Moiré target and the third Moiré target form first interference patterns (Moiré patterns). The second Moiré target and the fourth Moiré target also form second interference patterns (Moiré patterns). Further, the first interference patterns and the second interference patterns form a first pair of conjugated interference patterns.

Also, the first Moiré target, the second Moiré target, the third Moiré target, and the fourth Moiré target are a first set of targets. Such methods further establish a second set of targets that is identical to the first set of targets, and is inverted relative to the first set of targets, on the first optical mask and the second optical mask to produce a second pair of conjugated interference patterns that is inverted relative to the first pair of conjugated interference patterns. This additional second set of identical targets includes the same first-fourth Moiré targets that are described above. The only difference between the first-fourth Moiré targets in the second set of targets, is that such targets inverted relative to the first set of targets.

The first optical mask and the second optical mask are thus elements of a photolithographic integrated circuit manufacturing system. In order to manufacture integrated circuit structures, in item 115, the methods herein obtain (manufacture or procure) the first optical mask with the first Moiré target and the second Moiré target (of both sets of targets) thereon, and obtain the second optical mask with the third Moiré target and the fourth Moiré target (of both sets of targets) thereon.

Then, such methods perform a first exposure using the first optical mask in the manufacturing system, as part of the process of forming features on a layer of the integrated circuit structure, in item 120. The first exposure produces first markings corresponding to the first Moiré target in a location on the layer of the integrated circuit structure corresponding to the first location, and second markings corresponding to the second Moiré target in a location on the layer of the integrated circuit structure corresponding to the second location.

Similarly, in item 125, these methods perform a second exposure of the integrated circuit structure, aligned with the location of the first exposure, using the second optical mask in the manufacturing system. This second exposure can be for additional features on the same layer on which the first exposure formed features (when using different color masks), or can be for features on a second layer of the integrated circuit structure being added on top of the first layer, such as an additional photoresist, or additional functional layer.

Note that these methods are useful for both an overlay measurement application, and a scanner alignment application. Therefore, the third and fourth markings discussed herein can be actual markings appearing on a formed photoresist or the integrated circuit structure (where alignment of features is checked after lines are formed in the structure) if actual structures are formed in item 125; or, as shown in item 127, the third and fourth markings can be light projections used to align the second optical mask with the just-formed lines on the integrated circuit structure from the first exposure (scanner alignment). Note that, as shown by the dashed boxes and lines in FIG. 1, if the processing is used for scanner alignment in item 127, once alignment processing is completed in item 140, the processing returns to item 125 to form actual structures (which can then be subject to overlay measurement application in items 130-140).

The second exposure produces third markings corresponding to the third Moiré target in a location of the photoresist or the integrated circuit structure corresponding to the third location, and fourth markings corresponding to the fourth Moiré target in a location of the photoresist or the integrated circuit structure corresponding to the fourth location (for each of the sets of targets).

The first markings and the third markings combine to form first interference patterns having dark and light portions produced by a combination of the patterns of the first Moiré target and the third Moiré target. Also, the second markings and the fourth markings combine to form second interference patterns having dark and light portions produced by a combination of the patterns of the second Moiré target and the fourth Moiré target.

The first location and the second location on the first optical mask, and the third location and the fourth location on the second optical mask established are positioned in item 110 to align all the dark and light portions of the first interference patterns and the second interference patterns, when the first optical mask and the second optical mask are aligned to the same location when used for exposure. This allows these methods to determine the misalignment amount of the interference patterns based on how closely the dark and light portions of the first interference patterns and the second interference patterns (the kernels) are aligned in item 130, using an optical alignment measurement system that has sufficient resolution to detect those dark and light portions of Moiré interference patterns. Thus, in item 130, these methods determine interference pattern misalignment of the relatively dark and relatively light regions of the first interference patterns and the second interference patterns in both pairs of conjugated interference patterns when patterns in the second optical mask are over the integrated circuit layer.

The difference in the pitches causes an expected magnification of the first and second interference patterns, assuming no distortion created by the manufacturing system. However, distortion is likely present and, therefore, as shown in item 135, these methods calculate a calibrated magnification factor (of the interference pattern misalignment to the target misalignment) as a ratio of the difference of misalignment of the relatively dark and relatively light regions in the pairs of interference patterns, over twice the bias distance.

Therefore, such processing first calculates the self-calibrated magnification factor as a ratio of the difference of misalignment of kernels in the pairs of interference patterns, over twice the bias distance in item 135. Further, methods herein can track the calibration factor and misalignment amount for a given system to generate performance indicators for specific targets and/or systems in item 137. In other words, in item 137, the calibration factors of various individual masks, sets of masks, types of masks, etc., as well as different systems that produce or use masks (foundries, mask houses, etc.) can be tracked over time to rate such masks or systems, and determine how such masks or systems are performing. In other words, the performance indicators generated in item 137 show how closely the masks or systems are to the expected magnification (which is free of distortion).

Then, this processing uses the self-calibrated magnification factor from item 135 to calculate actual target overlay shift (mask misalignment), which equals the COG shift between top and bottom layers, divided by the self-calibrated magnification factor. Thus, in item 140, the methods herein divide the interference pattern misalignment by the magnification factor to produce a self-referenced and self-calibrated target misalignment amount, which is then output. Thus, in item 140, the overlay shift of the targets on the developed resist and underlying layer is fed back to the scanner to provide overlay offset inline.

Figure 2:
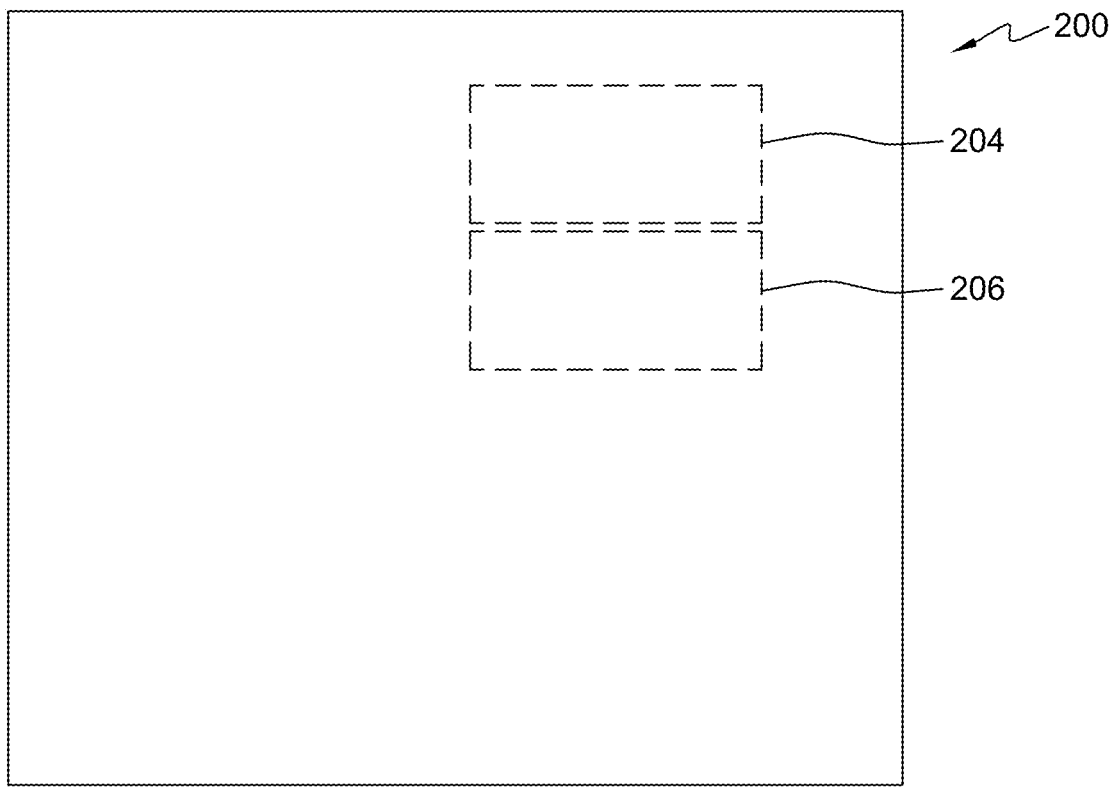
FIGS. 2-10 are schematic diagrams of optical masks according to embodiments herein.
Figure 3:
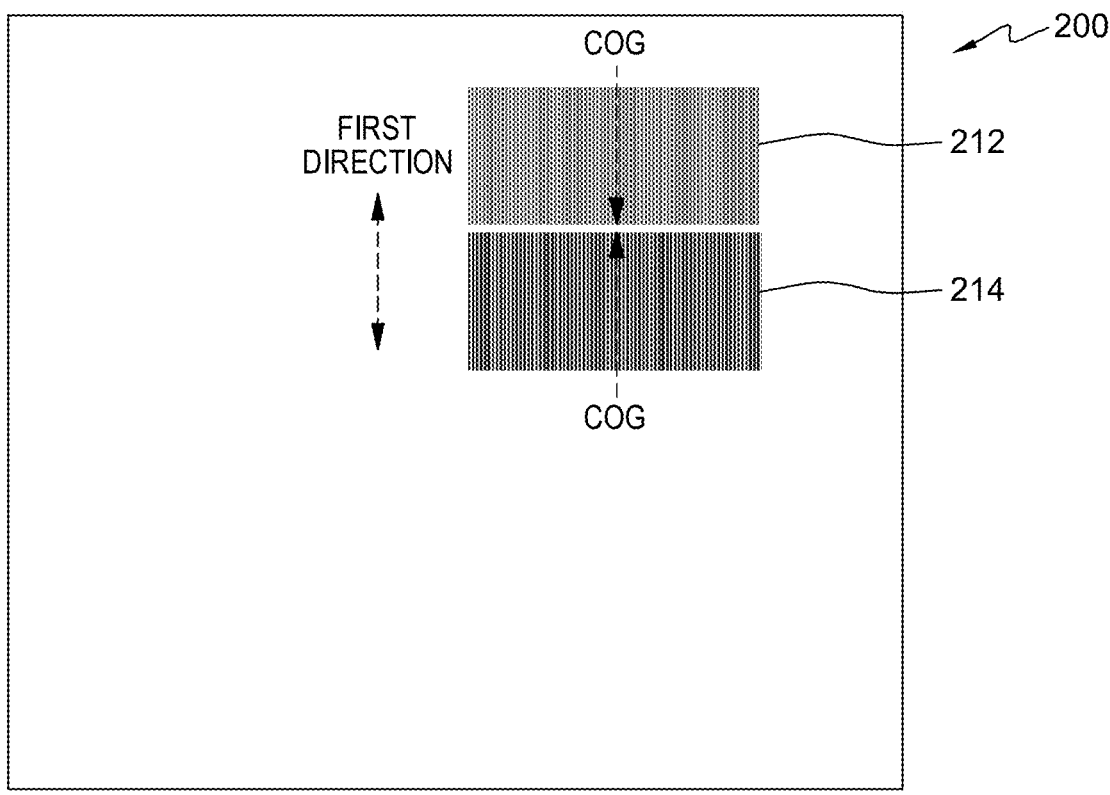

FIGS. 2-10 illustrate the foregoing using some exemplary Moiré targets. More specifically, FIG. 2 illustrates a portion of a first mask 200 having a first location 204 for a first Moiré target 212, and a second location 206 for a second Moiré target 214. FIG. 3 illustrates the first Moiré target 212 in the first location 204, and the second Moiré target 214 in the second location 206. FIG. 3 also illustrates that the first Moiré target 212 has features (e.g., parallel lines) occurring at a first pitch (e.g., spacing, frequency, occurrence, etc.), and the second Moiré target 214 has similar features occurring at a second pitch, which is different from the first pitch.

As shown in FIGS. 2 and 3, the first Moiré target 212 in the first location 204 is adjacent to, and aligned with, the second Moiré target 214 in the second location 206 on the first optical mask 200. More specifically, as shown in FIG. 3, the Moiré targets are parallel lines and gaps between the lines running in a certain (e.g., first) direction. The first and second Moiré targets 212 and 214 are immediately adjacent one another (in the first direction). Also, while the first and second Moiré targets 212 and 214 have different pitches, they are aligned, meaning that the center of gravity (COG) of each Moiré target lies along the same line (parallel to the first direction). The center of gravity is the location at the very middle (midline) of a target. In other words, the very center of the first Moiré target 212 lies along the same line (in the first direction) as the very center of the second Moiré target 214.

Figure 4:
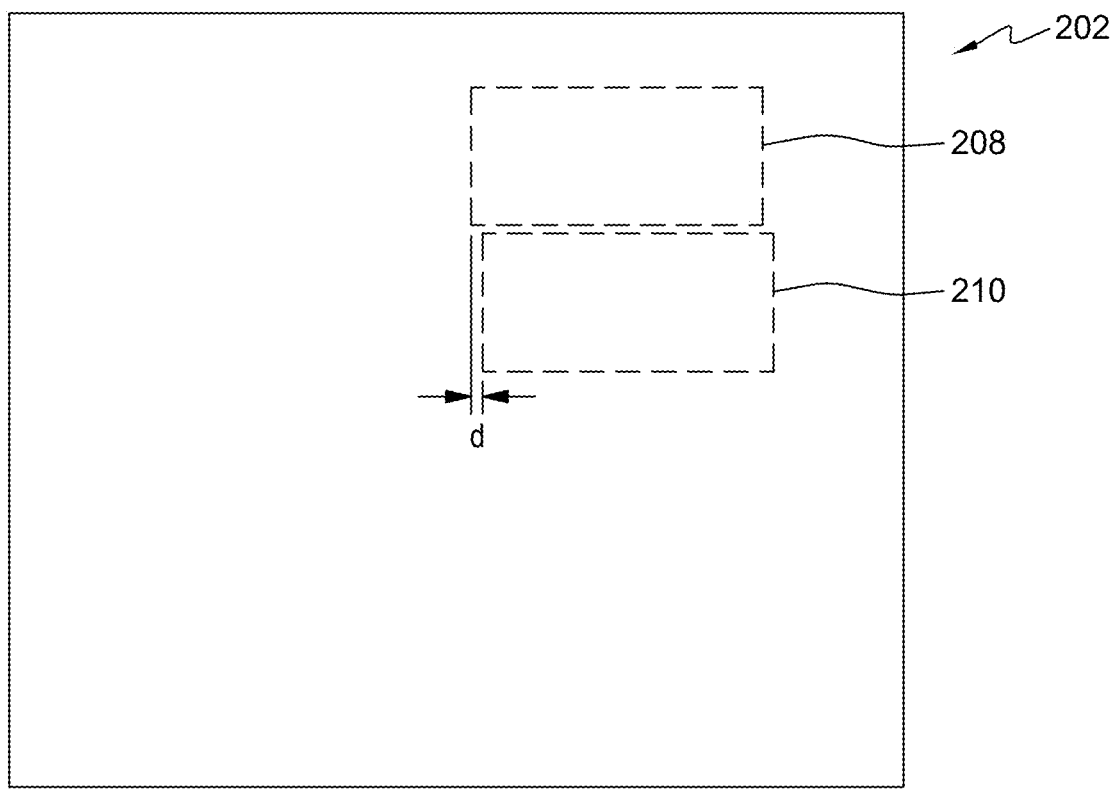
Figure 5:
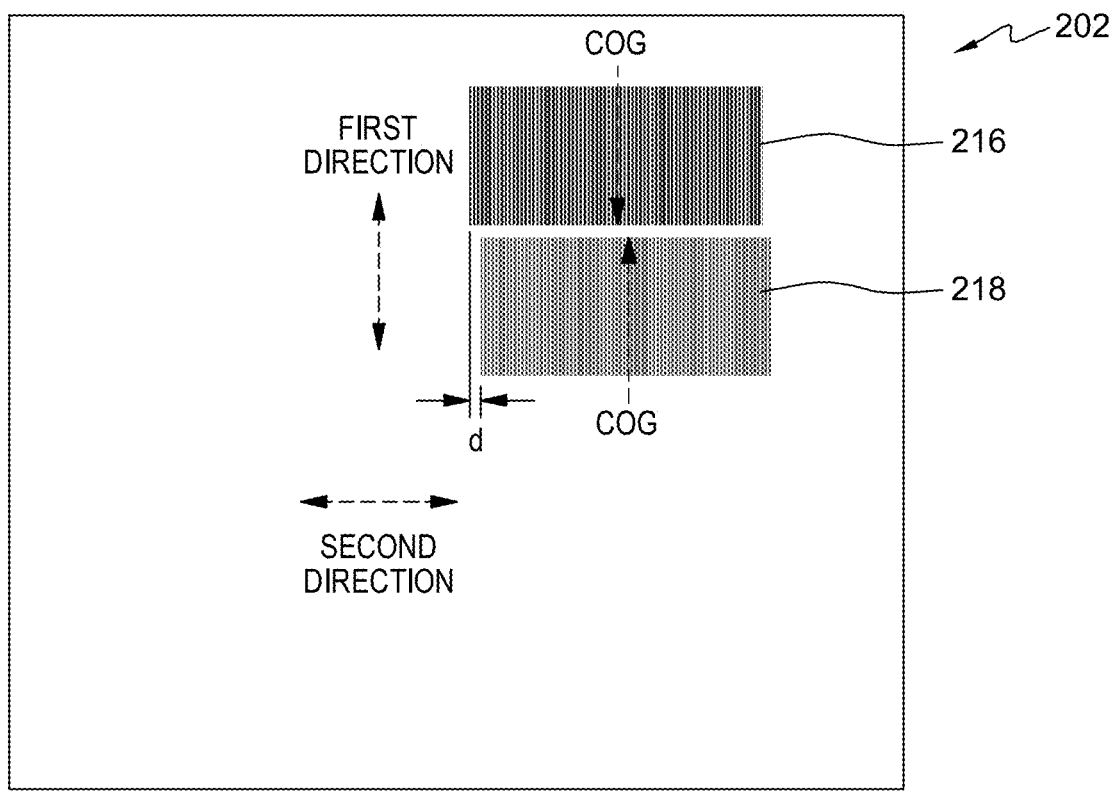

In a similar way, as shown in FIG. 4, the methods herein establish a third location 208 for a third Moiré target 216 and a fourth location 210 for a fourth Moiré target 218 on a second optical mask 202. FIG. 5 illustrates the third Moiré target 216 in the third location 208, and the fourth Moiré target 218 in the fourth location 210. FIG. 5 also illustrates that the third Moiré target 216 has features similar to that discussed above occurring at the second pitch, and the fourth Moiré target 218 has similar features occurring at the first pitch. In some implementations, the first Moiré target 212 and the fourth Moiré target 218 can be identical, and the second Moiré target 214 and the third Moiré target 216 can be identical. The first and third Moiré targets 212 and 216 make up a first pair of targets, and the second and fourth Moiré targets 214 and 218 make up a second pair of targets.

The third Moiré target 216 is similarly immediately adjacent to the fourth Moiré target 218; however, in contrast to the first optical mask 200, in addition to having different pitches, the third Moiré target 216 is not aligned with (is offset or biased relative to) the fourth Moiré target 218 on the second optical mask 202. In other words, the center of gravity of the third and fourth Moiré targets 216 and 218 do not lie along the same line, as shown in FIG. 5. As shown in FIG. 5, the distance d of this bias is in a second direction perpendicular to the first direction, and this bias distance allows a pair of interference patterns to be self-referencing and self-calibrating, and allows methods herein to generate a target performance indicator.

As noted above, the methods herein enhance target contrast by determining the minimum optical resolution of a photolithographic optical alignment measurement system. The methods can then establish the pitches of each pair of Moiré targets, by setting at least one of such pitches below the minimum optical resolution of the optical alignment measurement system. However, these methods set the difference between the pitches to generate Moiré interference patterns that are above the minimum optical resolution of the optical alignment measurement system. In other words, the optical alignment measurement system cannot detect the lines of the individual Moiré targets, but can detect the light and dark patterns that make up the kernels. These methods further enhance target contrast by establishing the pitches to produce at least five parallel marks in each of the Moiré targets.

These methods provide additional enhanced contrast by setting the first pitch relative to the second pitch of each pair of Moiré targets to balance the strength of reflection of the targets. When balancing the strength of reflection, these methods determine the strength of reflection based on sizes of features (e.g., line widths, gap widths, etc.) in the Moiré targets, and based on the transparency, thickness, surface texture/reflectivity, geometries etc., of the materials of the layers of the integrated circuit device being produced.

Note that these methods are useful for both an overlay measurement application, and a scanner alignment application. Therefore, the third and fourth markings discussed herein can be actual markings appearing on the integrated circuit structure (where alignment of features are checked after they are formed in the structure); or the third and fourth markings can be light projections used to align the second optical mask 202 with the previously formed marks in the substrate produced by the first exposure.

Therefore, the first location 204 and the third location 208 are the same location on the first and second masks 200 and 202. However, the second location 206 and the fourth location 210 are the different locations on the first and second masks 200 and 202. More specifically, the second location 206 is displaced from the fourth location 210 by the distance d.

Figure 6:
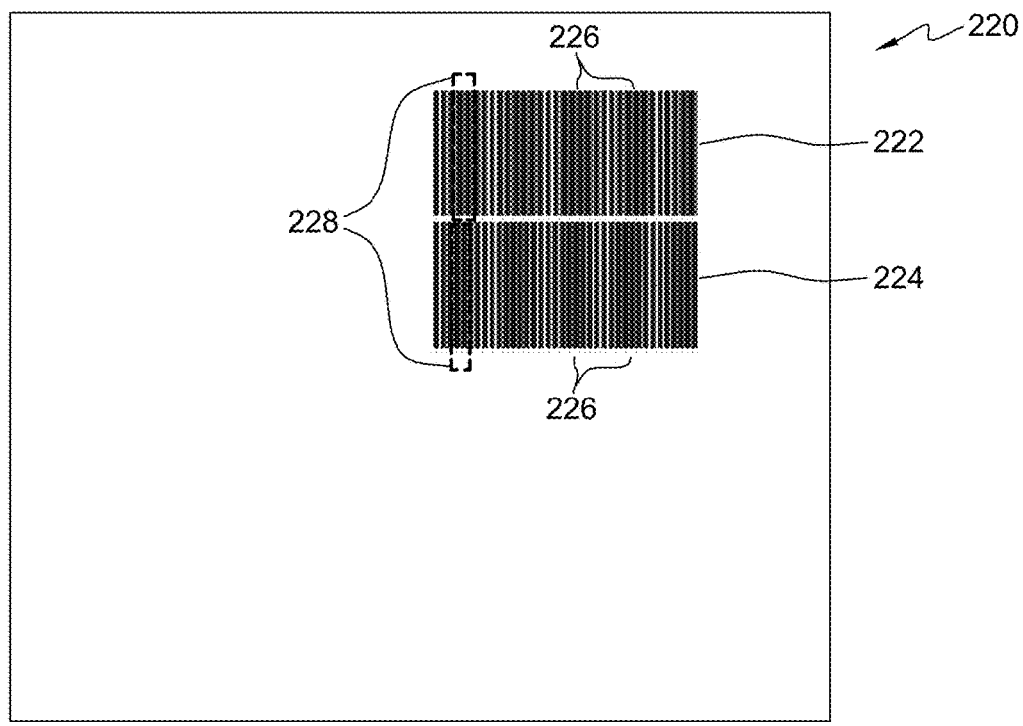

FIG. 6 illustrates a substrate 220 that has been patterned with the first and second masks 200 and 202 aligned at the same location. As shown in FIG. 6, first markings (corresponding to the first Moiré target 212 in a location corresponding to the first location 204) and third markings (corresponding to the third Moiré target 216 in a location corresponding to the third location 208) combine to form first interference patterns 222 having dark and light portions (Moiré interference patterns) produced by a combination of the patterns of the first Moiré target 212 and the third Moiré target 216. Also, the second markings (corresponding to the second Moiré target 214 in a location corresponding to the second location 206) and the fourth markings (corresponding to the fourth Moiré target 218 in a location corresponding to the fourth location 210) combine to form second interference patterns 222 having dark and light portions of Moiré interference patterns produced by a combination of the patterns of the second Moiré target 214 and the fourth Moiré target 218.

Note that these methods are useful for both an overlay measurement application, and a scanner alignment application. Therefore, the third and fourth markings discussed above can be actual markings appearing on a layer or photoresist of the integrated circuit structure (where alignment of features are checked after they are formed in a layer); or the third and fourth markings can be light projections used to align the second optical mask 202 with the previously formed first and second markings.

Items 226 in FIG. 6 are the "kernels" which are the dark portions of the interference patterns. Therefore, the first location 204 and the second location 206 on the first optical mask 200, and the third location 208 and the fourth location 210 on the second optical mask 202 are positioned to cause all the dark and light patterns produced by the first interference patterns and the second interference patterns to align, when the first optical mask 200 and the second optical mask 202 are aligned.

However, as shown by the dashed boxes 228 surrounding opposing kernels 226 in the first and second interference patterns 222 and 224 in FIG. 6, the kernels 226 are not aligned (dashed boxes 228, representing positions of the kernels 226 in FIG. 6, are not aligned). This allows these methods to determine the misalignment amount of the interference patterns based on how closely the dark and light kernels 226 of the interference patterns 222, 224 are aligned, using an optical alignment measurement system that has sufficient resolution to detect those dark and light kernels 226. Further, these methods calculate a magnification factor of the interference patterns 222, 224, and then divide the interference pattern misalignment by the magnification factor to produce a target misalignment amount.

As noted above, the first location 204 and the third location 208 are the same location on the first and second masks 200 and 202. However, the second location 206 is displaced from the fourth location 210 by the distance d. This arrangement of the targets causes the overlay kernel to shift in the opposite direction to the overlay misalignment, causing the magnification factor to double, because each difference between dark regions of kernels of the pair of interference patterns is twice the magnification factor of one of the interference patterns alone. In other words, because the dark regions of adjacent interference patterns move in opposite directions when there is mask misalignment, the dark regions are twice as far apart as each is individually from a non-moving reference point, which doubles the magnification factor when compared to measuring the distance of one interference pattern relative to the non-moving reference point.

Figure 7:
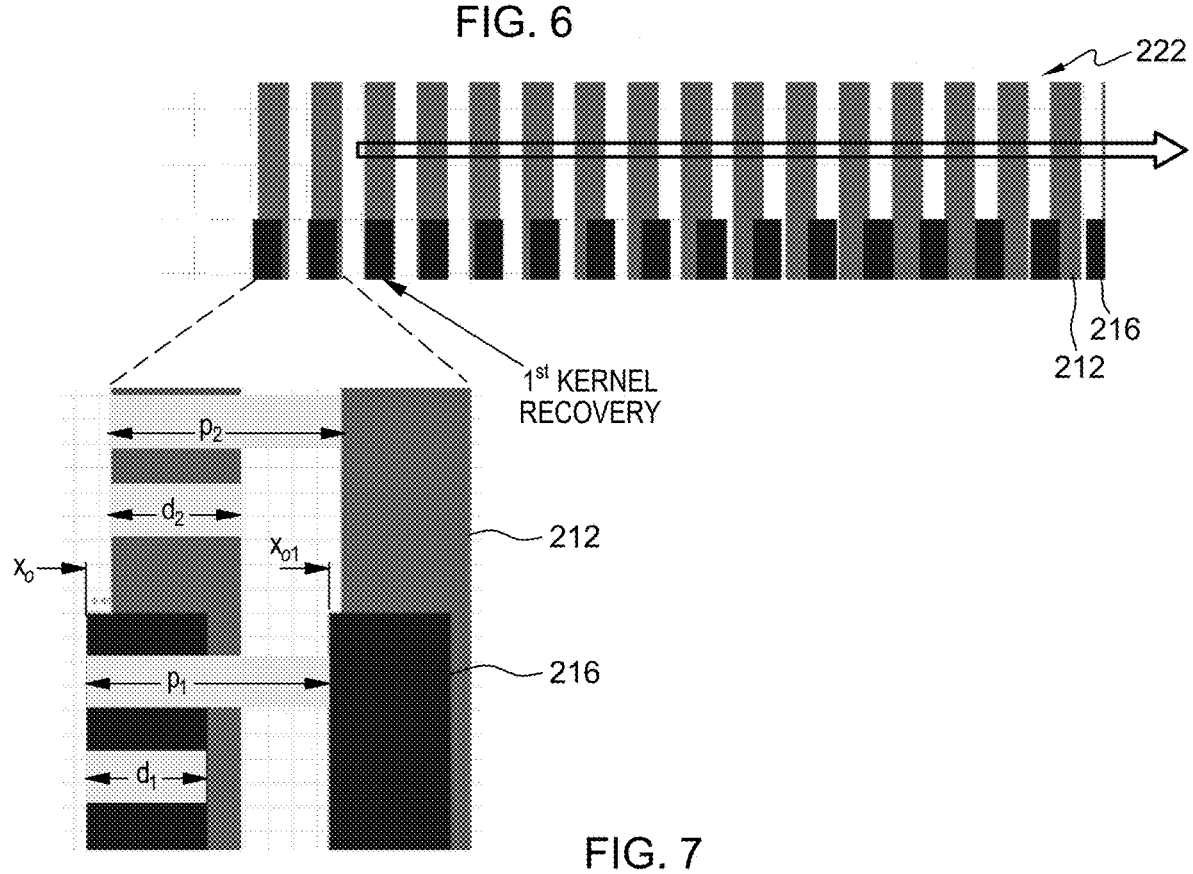

This is shown, for example, in FIG. 7 where the "1$^{st}$ kernel recovery" shows a location where lines of the first Moiré target 212 and the third Moiré target 216 align, which is not the correct location if the first and second masks 200 and 202 had been properly aligned. In order to determine alignment, methods and systems herein calculate a magnification factor of the interference patterns, and then divide the interference pattern misalignment by the magnification factor to produce a target misalignment amount. FIG. 7 is used to demonstrate aspects of calculation of the magnification factor.

The expanded portion within FIG. 7 illustrates the width of the lines ($d_2$) and the spacing or pitch ($p_2$) the first Moiré target 212; as well as the width of the lines ($d_1$) and the spacing or pitch ($p_1$) the third Moiré target 216. Further, the kernel shift of the first and third Moiré targets 212 and 216 is shown in FIG. 7 as $x_o$, $x_{o1}$, etc.

For calculation of the magnification factor, with reference to FIG. 7, in the case of $p_1 > p_2$ the kernel magnification factor (f) is set at the 1$^{st}$ pitch, $x_{o1} = (p_2 + x_0 - p_1)$; $\Delta x_0 = x_0 - x_{o1} = p_1 - p_2$. Therefore, to recover to the 0 kernel offset, the number of $p_1$ grating shift equals $x_0/\Delta x_0 = x_0/(p_1 - p_2)$. The maximum Moiré density shifts, for $x_0 * p_1/(p_1 - p_2)$, to the $x_0$ direction.

Thus, the overlay kernel shift OVL ($x_0$) is calculated by OVL $x_0 = x_0 * p_1/(p_1 - p_2)$. (1)

This correlates OVL and Moiré pitch $p_{Moiré}$ by OVL $(x_0) = x_0 * p_{Moiré}/p_2$. (2)

Therefore, this disclosure defines the magnification factor to be $f = p_1/(p_1 - p_2)$. (3)

In one example, $p_1$ can be 200 and $p_2$ can be 190. Using formula (3), this becomes $f = 200/(200-190) = 20$. Therefore, in this example the expected magnification factor is 20, meaning that misalignment of the kernels in the interference patterns will be 20 times as great as the mask misalignment, without distortion. This allows the expected mask misalignment factor to be based on the design of the targets (the pitches of the targets) and not on any measured observation. However, the magnification factor is calibrated to the observed misalignment, as discussed below.

In the conjugated case with $p_1 < p_2$, the magnification factor formula (3) is still valid, and results in a negative sign. This causes the overlay kernel to shift in the opposite direction to the overlay misalignment, causing the magnification factor to double, because each difference between dark regions of kernels of the pair of interference patterns is twice the magnification factor of one of the interference patterns alone. In other words, because the dark regions of adjacent interference patterns move in opposite directions when there is mask misalignment, the dark regions are twice as far apart as each is individually from a non-moving reference point, which doubles the magnification factor when compared to measuring the distance of one interference pattern relative to the non-moving reference point.

Therefore, the self-referencing MoiréOVL takes advantage of the kernel magnification effect and the reverse sign effect for conjugated pitch configurations ($p_1 > p_2$, $p_1 < p_2$) to avoid the use of reference points or marks, and to double the magnification factor. Therefore, the methods and systems herein are employed to overlay kernels for self-reference and, the self-reference doubles the magnification factor compared with a single Moiré pattern aligned to a non-moving reference point.

More specifically, for conjugated pitch settings ($p_a$, $p_b$) in which $p_a > p_b$, the target design is Target1: $p_1 = p_a$; $p_2 = p_b$ and Target2: $p_1 = p_a$; $p_2 = p_b$. The kernel magnification factor for these targets is therefore:

$$\text{Target1: } f_1 = \frac{p_1}{p_1 - p_2} = \frac{p_a}{p_a - p_b} \quad (4)$$

$$\text{Target2: } f_2 = \frac{p_1}{p_1 - p_2} = \frac{p_a}{p_a - p_b} \quad (4)$$

The self-referenced kernel shift is shown by $$\text{OVL}(x_0)_{SA} = \text{OVL}(x_0)_1 - \text{OVL}(x_0)_2 \quad (5)$$

Together with (1), (4), and (5)

$$OVL(x_0)_{SA} = \left(\frac{p_a + p_b}{p_a - p_b}\right) = (x_0) \qquad (6)$$

Therefore, the self-referenced kernel magnification factor ($f_{SR}$) can be represented as:

$$f_{SR} = \frac{p_a + p_b}{|p_a - p_b|} \qquad (7)$$

The first Moiré target and the third Moiré target form first interference patterns. The second Moiré target and the fourth Moiré target also form second interference patterns. Further, the first interference patterns and the second interference patterns form a first pair of conjugated interference patterns.

The first Moiré target, the second Moiré target, the third Moiré target, and the fourth Moiré target are a first set of targets. Such methods further establish a second set of targets that is identical to the first set of targets, and that is inverted relative to the first set of targets, on the first optical mask and the second optical mask, to produce a second pair of conjugated interference patterns that is inverted relative to the first pair of conjugated interference patterns.

Figure 8:
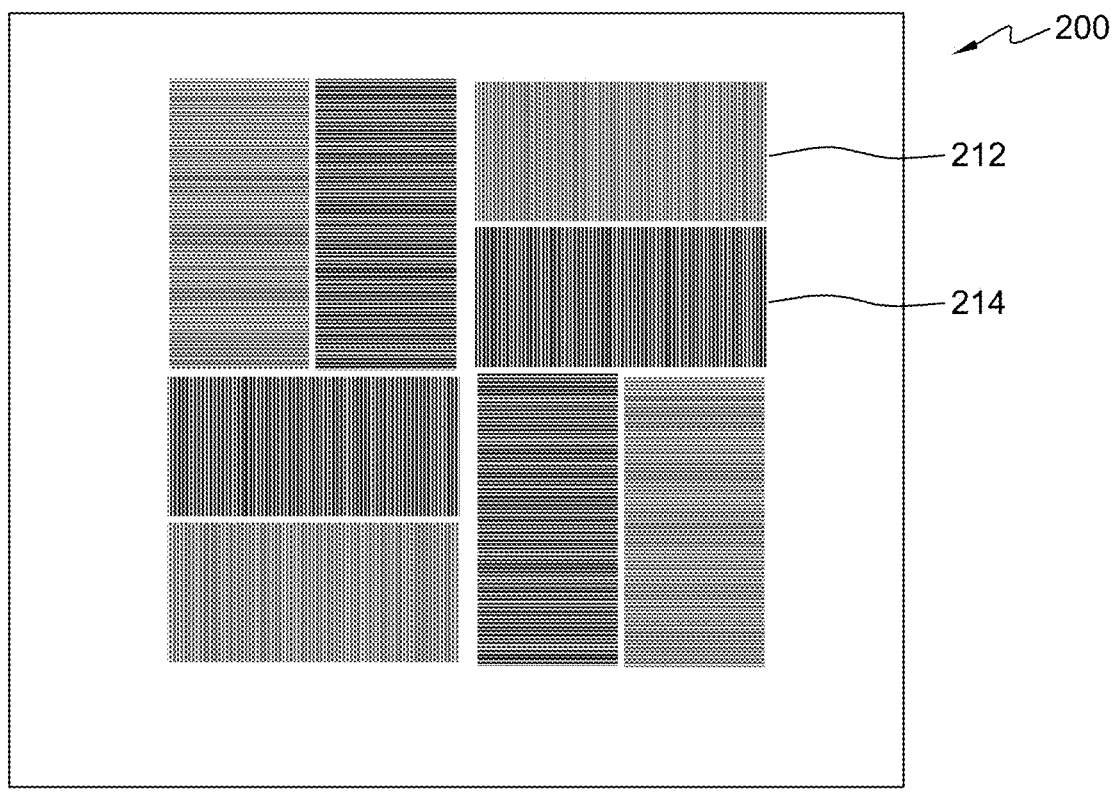
Figure 9:
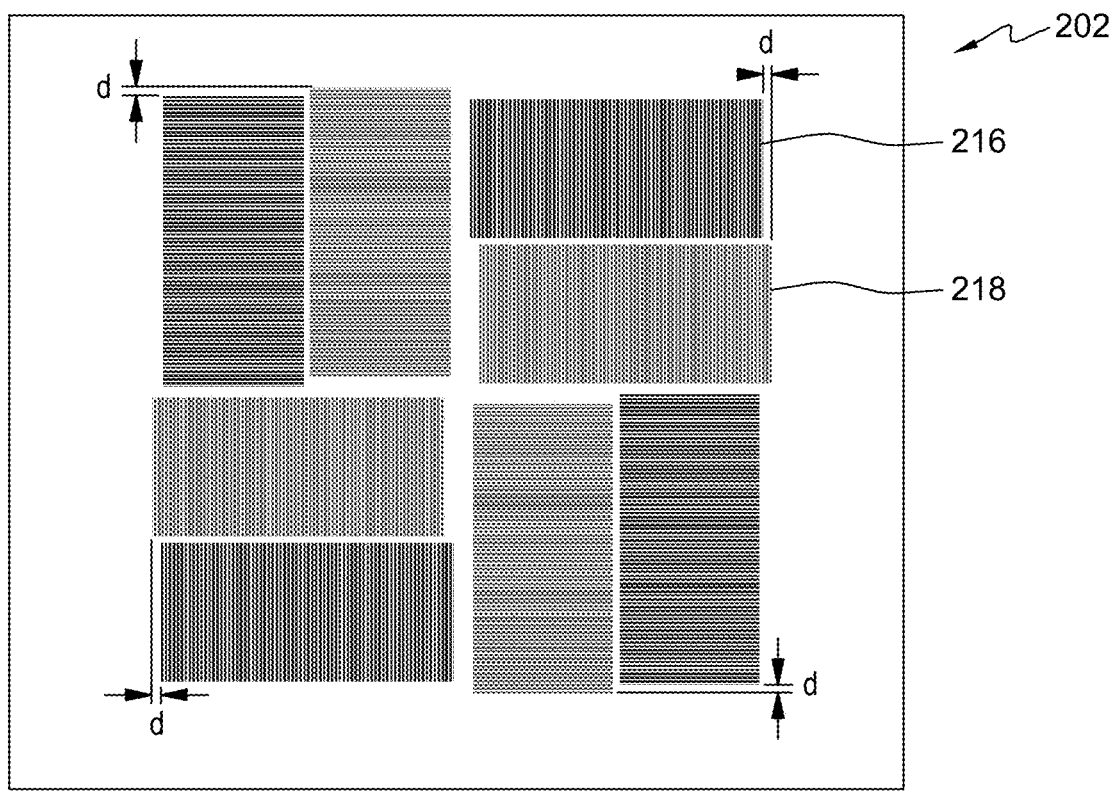

FIGS. 8 and 9 illustrate such structure, and these drawings show that the first and second masks 200 and 202 can include additional sets of first-fourth Moiré targets 212, 214, 216, 218 in different orientations (e.g. inverted, perpendicular, inverted and perpendicular, etc., to those shown in FIGS. 3 and 5) in addition to the first set of Moiré targets discussed above. Specifically FIGS. 8 and 9 illustrate four sets of four targets on the two masks, two set are perpendicular to the other two, and each set that is parallel is inverted with respect to the other.

Figure 10:
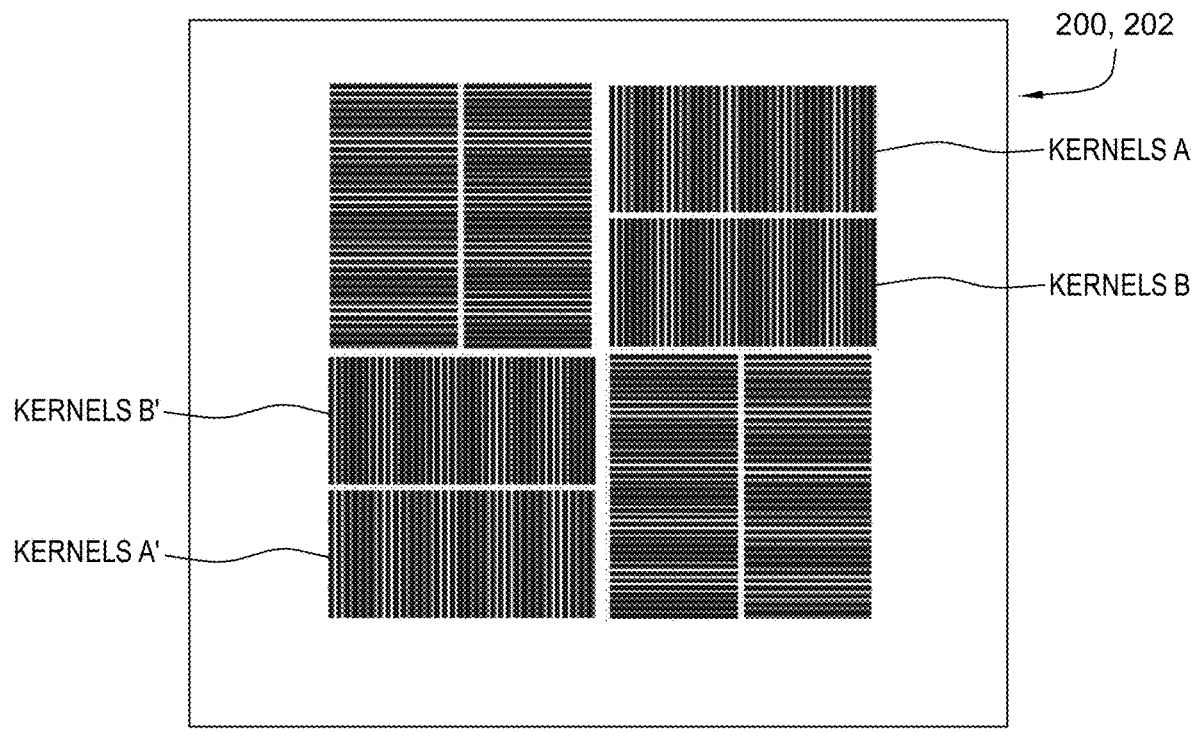
Figure 11:
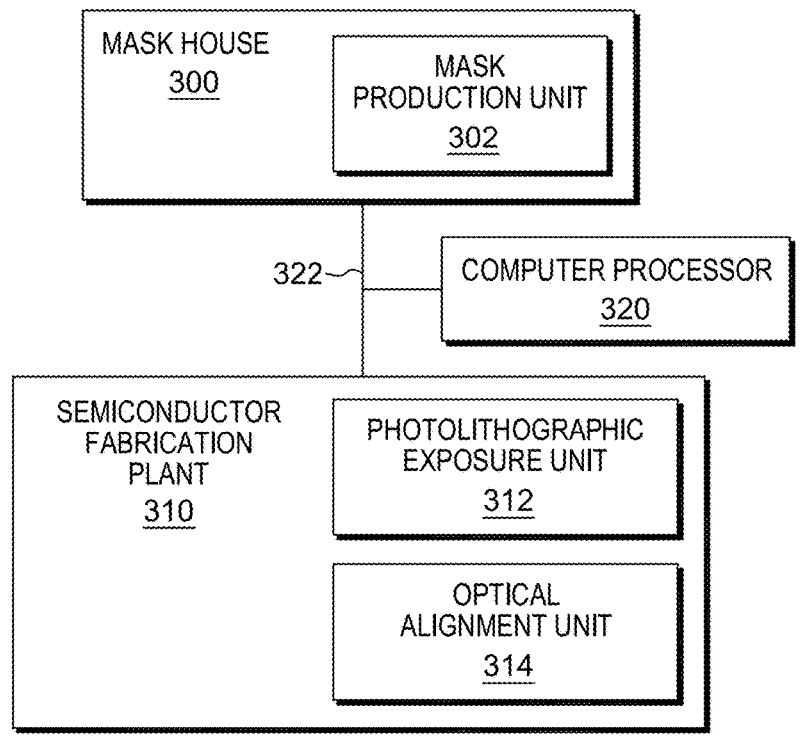
FIG. 11 is a schematic diagram of a hardware system according to embodiments herein.

FIG. 10 illustrates the various kernels that can be produced from the overlay of the marks resulting from the masks shown in FIGS. 8 and 9. With respect to magnification calibration, in this example there is one set of four targets (or kernel pair (kernels A and B)) and a corresponding identical, but inverted second set of four targets (or kernel pair (kernels A' and B')) in FIG. 10. More specifically, in this example, if kernels A and B have bias d, then kernels A and B have bias −d because kernels A' and B' are inverted relative to kernels A and B. Therefore, with misalignment amount (actual OV shift) referred to as OV, the kernel shift between A and B is A−B=(d+OV)*$f_{SC}$. Similarly, the kernel shift between A' and B' is A'−B'=(−d+OV)*$f_{SC}$. Therefore, the SC magnification factor is calculated by the kernel shift offset between (A−B) and (A'−B') which is:

$$f_{SC} = \frac{(A-B) - (A'-B')}{2d}$$

and the actual OV can be calculated as:

$$OV = \frac{(A+A')/2 - (B+B')/2}{f_{SC}}.$$

In other words, the expected magnification factor is calculated from the design of the targets, and is based on the difference between the designed pitches of the overlaid targets. However, the actual magnification factor will be different because of distortions caused by the photolithographic system. Rather than using a time consuming SEM to measure the actual magnification, the methods and systems herein calculate the actual magnification based on the differences of the relatively inverted pairs of interference patterns (one pair: kernels A and B; second pair kernels A' and B').

As shown by the above calculations, this processing first finds the self-calibrated magnification factor ($f_{SC}$) as a ratio of the difference of misalignment of kernels in the pairs of interference patterns ((A−B) less (A'−B')) over twice the bias distance (2 d). Then this processing uses the self-calibrated magnification factor ($f_{SC}$) to calculate actual OV shift (actual mask misalignment), which as shown above, equals the averaged COG shift between top and bottom layers ((A+A')/2−(B+B')/2) divided by the self-calibrated magnification factor ($f_{SC}$). Self-calibration (SC) and self-referencing (SR) processes are therefore integrated and are calculated in one operation, without sacrificing target space or measurement throughput.

Because of the pitch differences of the first and third targets 212 and 216, and the pitch differences of the second and fourth targets 214 and 218, the interference patterns are calculated to produce an expected magnification of the alignment of the lines in the targets. Therefore, in addition to being self-referencing, the methods and systems herein are also self-calibrating. The calibration integrated in SR-MoiréOVL calibrates the magnification factor for individual marks on the wafer/mask. This processing detects the deviation of the magnification factor from the design's theoretical (undistorted/unmagnified) value. This deviation may be caused by mark damage, etc. The self-calibrated magnification factor ($f_{SC}$) is fed back to the measurement results to calibrate the actual OVL shift using Actual OVL shift=MoiréOVL/$f_{SC}$.

How far the calibrated factor deviates from the theoretical value is a key performance indicator (KPI) for mark quality and measurement quality as follows $$Moir\acute{e}OVL\text{-}KPI = \frac{|f_{SR} - f_{SC}|}{f_{SR}}$$

Therefore, such processing determine interference pattern misalignment of the relatively dark and relatively light regions of the first interference patterns and the second interference patterns in both pairs of conjugated interference patterns when patterns in the second optical mask are over the integrated circuit layer. Thus, a magnification factor (of the interference pattern misalignment to the target misalignment) is calculated as a ratio of the difference of misalignment of the relatively dark and relatively light regions in the pairs of interference patterns, over twice the bias distance. Then, the processing herein divides the interference pattern misalignment by the magnification factor to produce a self-referenced and self-calibrated target misalignment amount, which is then output.

Because the methods and systems herein utilize lines in the Moiré targets that are too small to be recognized by optical systems; but provide a self-referenced, self-calibrated misalignment amount using optical systems that can recognize the Moiré interference patterns, the methods and systems herein can eliminate the need to perform alignment using slower throughput systems such as scanning electron microscopes. Therefore, the methods and systems herein can eliminate the necessity of using SEMOVL for the OVL final calibration. This is especially true because the SR-Moiré

OVL disclosed above offers comparable accuracy and precision as SEMOVL, which permits removing the SEMOVL in production as the OVL final calibration.

In addition, the methods and systems herein reduce OVL inaccuracy, because OV inaccuracy factors (such as grating asymmetry) are not amplified in MoiréOVL, and such are reduced by a factor of 1/magnification with methods and systems herein. Additionally, with methods and systems herein, the self-calibration offers a good KPI for mark/measurement quality, without sacrificing throughput. The integrated self-calibration processing herein calculates the magnification factor for each mark on the wafer individually. The deviation from the design magnification factor is used as a key performance indicator of the mark quality. Further, the methods and systems provide shrinkage of target size. The high accuracy and precision of the Moiré target provided by methods and systems herein allow such Moiré targets to be reduced in size.

In addition, the methods and systems herein minimize the requirements for imaging tool. In the MoiréOVL processing described above, the kernel CD, pitches and kernel magnification factor can be adjusted by changing top and bottom gratings. Image resolution is not required to capture overlay misalignment directly, and by adjusting the magnification factor, nanometer scale overlay offset can be magnified larger than one order. Magnification effects greatly lower the requirement for optic abbreviations and imaging resolution. Therefore, current state-of-the-art IBO systems can fully support the previously described MoiréOVL processing. This allows current AIM overlay to be easily implemented in the SR-MoiréOVL process described above.

Also, the methods and systems herein are more stable to process variations. With the MoiréOVL process presented above, the kernel CD, and pitches are defined by pattern density variations. Process variation changes the contrast of gratings, however pattern density of Moiré pitches are less affected by the contrast, allowing more stability.

Various systems herein can include, among other components, a processor 320; and a manufacturing system 310 and an optical alignment measurement system 314 connected to the processor 320 over the computerized network 322. The processor 320 is specifically adapted to, or is capable of, establishing a first location for a first Moiré target on a first optical mask, such that the first Moiré target has features occurring at a first pitch. The processor 320 is also specifically adapted to, or is capable of, establishing a second location for a second Moiré target on the first optical mask, such that the second Moiré target has features occurring at a second pitch, different from the first pitch, and such that the first Moiré target is adjacent to, and aligned with, the second Moiré target on the first optical mask.

The processor 320 is similarly specifically adapted to, or is capable of, establishing a third location for a third Moiré target on a second optical mask, such that the third Moiré target has features occurring at the second pitch. The processor 320 is further specifically adapted to, or is capable of, establishing a fourth location for a fourth Moiré target on the second optical mask, such that the fourth Moiré target has features occurring at the first pitch, and such that the third Moiré target is adjacent to, and not aligned with, the fourth Moiré target on the second optical mask.

The first interference patterns and the second interference patterns form a first pair of conjugated interference patterns. The processor 320 is specifically adapted to, or is capable of, establishing additional identical targets on the first optical mask and the second optical mask to produce a second pair of conjugated interference patterns that is inverted relative to the first pair of conjugated interference patterns.

Moving to the manufacturing system 310, a mask house 300 (or similar) with a mask production unit 302 is included in such a system for purposes herein, and is specifically adapted to, or is capable of, producing the first optical mask with the first Moiré target and the second Moiré target thereon. The manufacturing system 310 is similarly specifically adapted to, or is capable of, producing the second optical mask with the third Moiré target and the fourth Moiré target thereon.

Additionally, the manufacturing system 310 includes a fabrication facility (wafer fab, or similar) having a photolithographic exposure unit 312 for purposes herein that is specifically adapted to, or is capable of, exposing a first exposure of an integrated circuit structure using the first optical mask in the manufacturing system 310, such that the first exposure produces first markings corresponding to the first Moiré target in a location corresponding to the first location, and second markings corresponding to the second Moiré target in a location corresponding to the second location. The manufacturing system 310 is similarly specifically adapted to, or is capable of, exposing/forming a second exposure of the integrated circuit structure aligned with the location of the first exposure using the second optical mask in the manufacturing system 310, such that the second exposure produces third markings corresponding to the third Moiré target in a location corresponding to the third location, and fourth markings corresponding to the fourth Moiré target in a location corresponding to the fourth location.

As noted above, the first markings and the third markings combine to form first interference patterns having dark and light portions of Moiré interference patterns produced by a combination of the patterns of the first Moiré target and the third Moiré target, and wherein the second markings and the fourth markings combine to form second interference patterns having dark and light portions of Moiré interference patterns produced by a combination of the patterns of the second Moiré target and the fourth Moiré target.

The processor 320 is further specifically adapted to, or is capable of, establishing the first pitch and the second pitch by setting the first pitch and the second pitch below the minimum optical resolution, setting a difference between the first pitch and the second pitch to generate the first interference patterns and the second interference patterns that are above the minimum optical resolution, and setting the first pitch relative to the second pitch to balance the strength of reflection of the first Moiré target and reflection of the second Moiré target. More specifically, the processor 320 establishes the first pitch and the second pitch by setting the first pitch and the second pitch to produce at least five parallel marks in each of the first Moiré target, the second Moiré target, the third Moiré target, the fourth Moiré target. Additionally, the processor 320 sets the first pitch relative to the second pitch to balance the strength of reflection by determining the strength of reflection based on the sizes of features in the first Moiré target, the second Moiré target, the third Moiré target, the fourth Moiré target; and based on the transparency characteristics of materials and geometries of the first exposure and the second exposure.

The first location and the second location on the first optical mask, and the third location and the fourth location on the second optical mask, are positioned to align all the dark and light portions of the first interference patterns and the second interference patterns, when the first optical mask and the second optical mask are aligned when used in the manufacturing system 310.

The optical alignment measurement system 314 is specifically adapted to, or is capable of, determining interference pattern misalignment of the relatively dark and relatively light regions of the first interference patterns and the second interference patterns in both pairs of conjugated interference patterns, when patterns in the second optical mask are over the integrated circuit layer. Also, the processor 320 is specifically adapted to, or is capable of, calculating a magnification factor of the interference pattern misalignment to target misalignment, as a ratio of the difference of misalignment of the relatively dark and relatively light regions in the pairs of interference patterns, over twice the bias distance. Similarly, the processor 320 is specifically adapted to, or is capable of, dividing the interference pattern misalignment by the magnification factor to produce and output a self-referenced and self-calibrated target misalignment amount.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

While only one or a limited number of masks are illustrated in the drawings, those ordinarily skilled in the art would understand that many different types mask could be simultaneously formed with the embodiment herein and the drawings are intended to show simultaneous formation of multiple different types of masks; however, the drawings have been simplified to only show a limited number of masks for clarity and to allow the reader to more easily recognize the different features illustrated. This is not intended to limit this disclosure because, as would be understood by those ordinarily skilled in the art, this disclosure is applicable to structures that include many of each type of mask shown in the drawings.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A structure comprising:
   a substrate including a first layer and a second layer overlaying the first layer;
   a first feature having a first pitch, wherein the first feature is in a first location of the first layer;
   a second feature having a second pitch different than the first pitch, wherein the second feature is in a second location of the first layer that is adjacent to the first location;
   a third feature having the second pitch, wherein the third feature is in a third location of the second layer that corresponds to the first location of the first layer; and
   a fourth feature having the first pitch, wherein the fourth feature is in a fourth location of the second layer that corresponds to the second location of the first layer,
   wherein the first feature is aligned with the second feature, and the third feature is misaligned with the fourth feature by a bias distance.

2. The structure according to claim 1, wherein the first feature and the third feature are structured to form first interference patterns, and the second feature and the fourth feature are structured to form second interference patterns.

3. The structure according to claim 2, wherein the first pitch and the second pitch are below a minimum optical resolution of an optical alignment measurement system, and wherein the first interference patterns and the second interference patterns are above the minimum optical resolution.

4. The structure according to claim 1, wherein each of the first feature, the second feature, the third feature and the fourth feature comprise at least five Moiré parallel line features.

5. The structure according to claim 1, wherein the first pitch is greater than the second pitch, or the first pitch is less than the second pitch.

6. A method comprising:
   establishing a first target having a first pitch on a first mask;
   establishing a second target having a second pitch on the first mask, wherein the second target is adjacent to the first target;
   establishing a third target having the second pitch on a second mask; and
   establishing a fourth target having the first pitch on the second mask, wherein the third target is adjacent to the fourth target, wherein the first target is aligned with the second target, wherein the third target is misaligned with the fourth target by a bias distance, wherein the first target and the third target form first interference patterns, and wherein the second target and the fourth target form second interference patterns.

7. The method according to claim 6, further comprising:
   determining a minimum optical resolution of an optical alignment measurement system; and
   establishing the first pitch and the second pitch by:
      setting the first pitch and the second pitch below the minimum optical resolution;
      setting a difference between the first pitch and the second pitch to generate the first interference patterns and the second interference patterns that are above the minimum optical resolution; and
      setting the first pitch relative to the second pitch to balance a strength of reflection of the first target and reflection of the second target.

8. The method according to claim 7, wherein the establishing the first pitch and the second pitch further comprises setting the first pitch and the second pitch to produce at least five parallel marks in each of the first target, the second target, the third target, the fourth target.

9. The method according to claim 7, wherein the setting the first pitch relative to the second pitch to balance a strength of reflection comprises determining the strength of reflection based on:
   sizes of features in the first target, the second target, the third target, the fourth target; and
   transparency characteristics of materials and geometries of layers being manufactured.

10. The method according to claim 6, further comprising:
    performing a first exposure using the first optical mask to produce the first layer having the first target and the second target of the first set of targets and the second set of targets; and
    performing a second exposure using the second optical mask, wherein the second exposure projects the third target and the fourth target of the first set of targets and the second set of targets on the first layer.

11. The method according to claim 6, further comprising:
    determining interference pattern misalignment of the first interference patterns and the second interference patterns;
    calculating a magnification factor of the first interference patterns and the second interference patterns; and
    dividing the interference pattern misalignment by the magnification factor to produce and output an actual misalignment amount.

12. The method according to claim 11, wherein a difference between the first pitch and the second pitch causes an expected magnification of the first interference patterns and the second interference patterns based on there being no distortion created by a manufacturing system, and wherein the magnification factor is different from the expected magnification by a calibration factor that is based on optically measured differences of the interference pattern misalignment which makes the actual misalignment amount self-calibrating.

13. A method comprising:
    establishing a first target having a first pitch on a first layer using a first mask;

establishing a second target having a second pitch on the first layer using the first mask, wherein the second target is adjacent to the first target;

projecting a third target having the second pitch on the first layer using a second mask; and projecting a fourth target having the first pitch on the first layer using the second mask, wherein the third target is projected adjacent to the fourth target, wherein the first target is aligned with the second target, wherein the third target is misaligned with the fourth target by a bias distance, wherein the first target and the third target form first interference patterns, and wherein the second target and the fourth target form second interference patterns.

14. The method according to claim 13, further comprising:

determining a minimum optical resolution of an optical alignment measurement system; and establishing the first pitch and the second pitch by:
  setting the first pitch and the second pitch below the minimum optical resolution;
  setting a difference between the first pitch and the second pitch to generate the first interference patterns and the second interference patterns that are above the minimum optical resolution; and
  setting the first pitch relative to the second pitch to balance a strength of reflection of the first target and reflection of the second target.

15. The method according to claim 14, wherein the establishing the first pitch and the second pitch further comprises setting the first pitch and the second pitch to produce at least five parallel marks in each of the first target, the second target, the third target, the fourth target.

16. The method according to claim 14, wherein the setting the first pitch relative to the second pitch to balance a strength of reflection comprises determining the strength of reflection based on:

sizes of features in the first target, the second target, the third target, the fourth target; and transparency characteristics of materials and geometries of layers being manufactured.

17. The method according to claim 13, further comprising:

determining interference pattern misalignment of the first interference patterns and the second interference patterns;

calculating a magnification factor of the first interference patterns and the second interference patterns; and dividing the interference pattern misalignment by the magnification factor to produce and output an actual misalignment amount.

18. The method according to claim 17, wherein a difference between the first pitch and the second pitch causes an expected magnification of the first interference patterns and the second interference patterns based on there being no distortion created by a manufacturing system, and wherein the magnification factor is different from the expected magnification by a calibration factor that is based on optically measured differences of the interference pattern misalignment which makes the actual misalignment amount self-calibrating.

19. The method according to claim 13, further comprising:

performing a first exposure using the first optical mask to produce the first layer having the first target and the second target of the first set of targets and the second set of targets; and performing a second exposure using the second optical mask, wherein the second exposure projects the third target and the fourth target of the first set of targets and the second set of targets on the first layer.

* * * * *